United States Patent
Ulander

(10) Patent No.: US 6,239,963 B1
(45) Date of Patent: May 29, 2001

(54) WAFER SUPPORT WITH ELECTROSTATIC DISCHARGE BUS

(75) Inventor: Torben J. H. Ulander, Sunnyvale, CA (US)

(73) Assignee: Fortrend Engineering Corp, Sunnyvale, CA (US)

( * ) Notice: Subject to any disclaimer, the term of this patent is extended or adjusted under 35 U.S.C. 154(b) by 0 days.

(21) Appl. No.: 09/337,046

(22) Filed: Jun. 21, 1999

(51) Int. Cl.$^7$ .................................................. H05F 3/02
(52) U.S. Cl. ................................... 361/212; 361/220
(58) Field of Search ..................... 361/212, 220–222; 206/709, 710–712

(56) References Cited

U.S. PATENT DOCUMENTS

| | | | |
|---|---|---|---|
| 4,677,521 | * 6/1987 | Frazier | 361/220 |
| 4,791,524 | * 12/1988 | Teigen et al. | 361/212 |
| 4,985,719 | * 1/1991 | Tsurukawa et al. | 361/212 |
| 5,029,041 | * 7/1991 | Robinson et al. | 361/220 |
| 5,193,969 | 3/1993 | Rush et al. | 414/404 |
| 5,708,552 | * 1/1998 | Han et al. | 361/779 |
| 5,775,752 | * 7/1998 | Niemirowski et al. | 294/28 |
| 5,788,082 | * 8/1998 | Nyseth | 206/711 |
| 5,880,924 | * 3/1999 | Kumar et al. | 361/234 |

* cited by examiner

*Primary Examiner*—Fritz Fleming
(74) *Attorney, Agent, or Firm*—D. E. Schreiber

(57) ABSTRACT

A wafer support featuring a polymer rack formed of parallel, spaced apart comb structures with spaced apart teeth into which wafers can loosely fit and a shank immediately below the teeth which is connected to lifter shafts. A conductive polymer bus bar runs along the shank less than a millimeter below the base of the teeth. The polymer rack will fit through a standard size wafer cassette for wafer transfer. The bus bar is connected to electrical ground, found at metal lifter shafts, by means of conductive polymer cross bars. The bus bar is close enough to one or more wafers to allow arcing from the wafer to the bus bar and then to ground when a wafer becomes highly charged with electrostatic charge, thereby discharging the wafer.

20 Claims, 6 Drawing Sheets

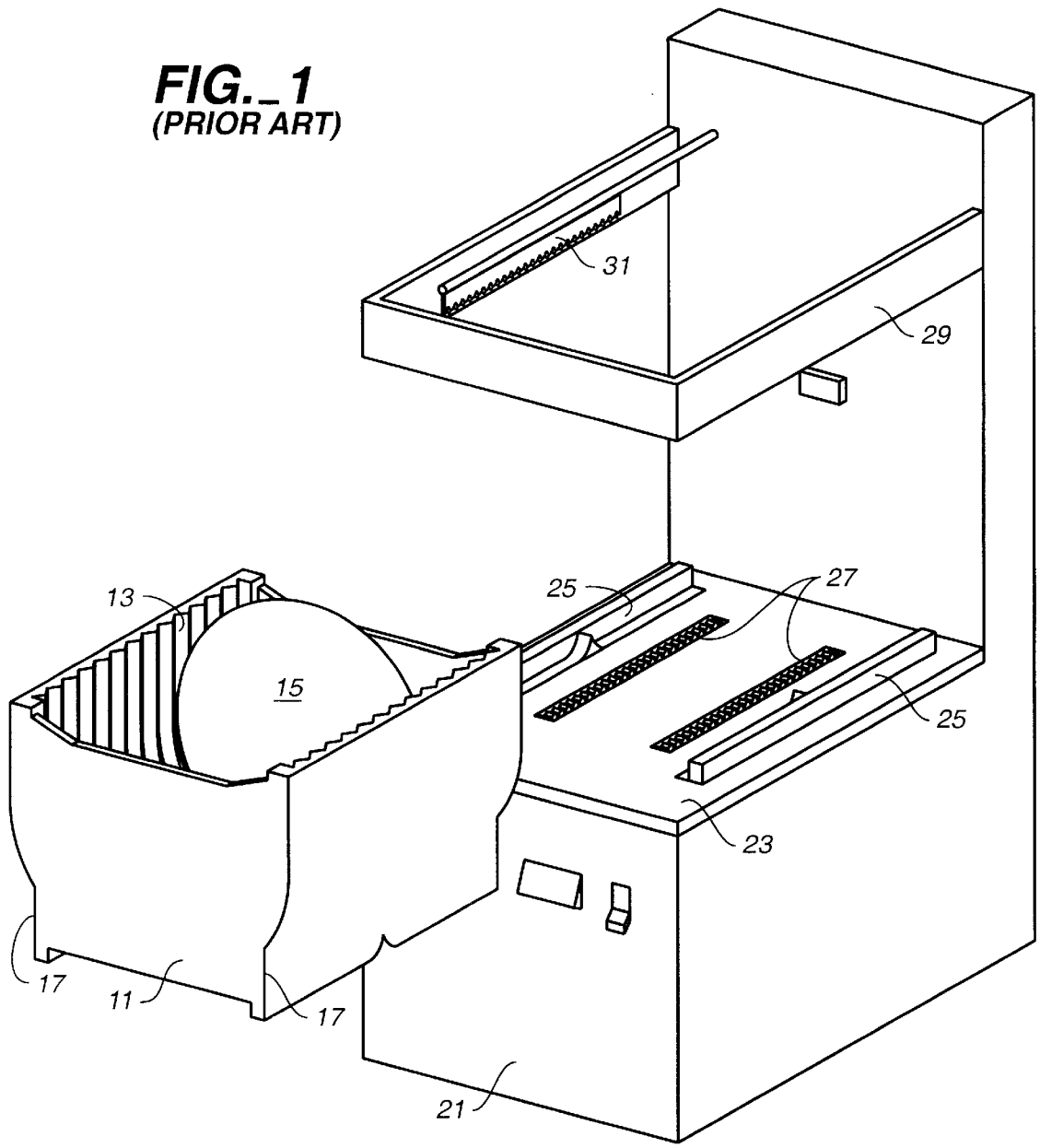
FIG._1
(PRIOR ART)

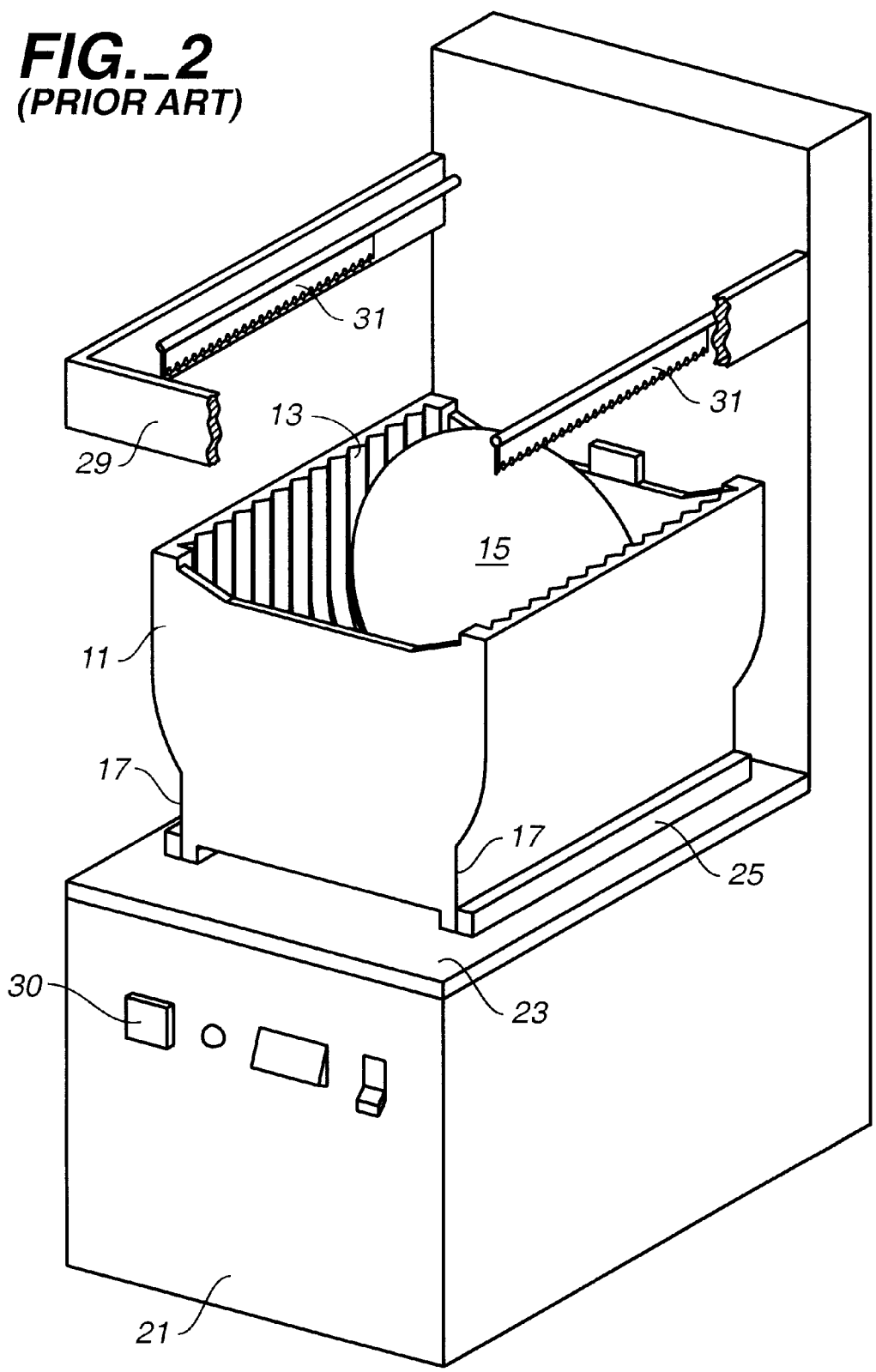
FIG._2
(PRIOR ART)

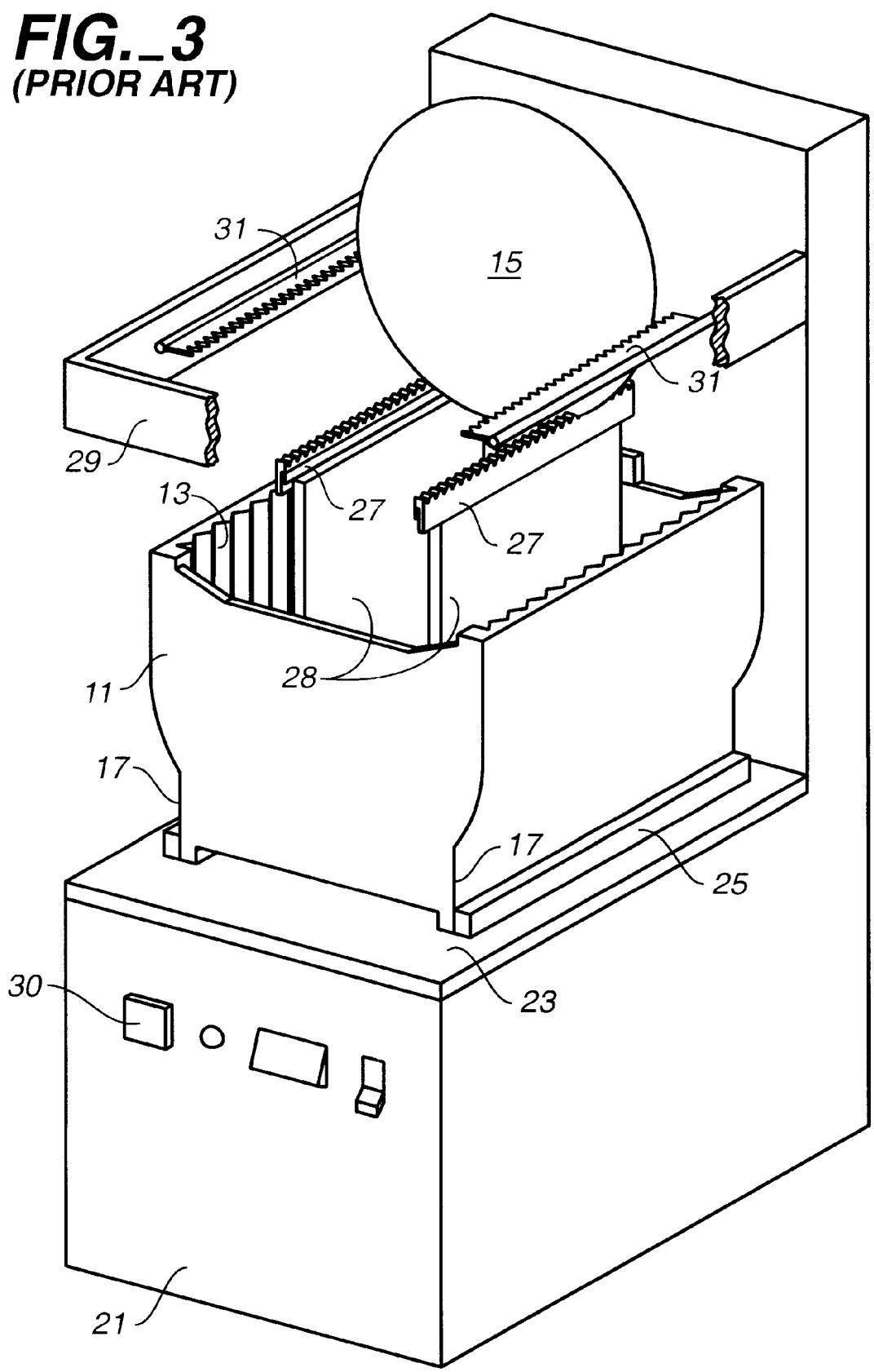
FIG._3
*(PRIOR ART)*

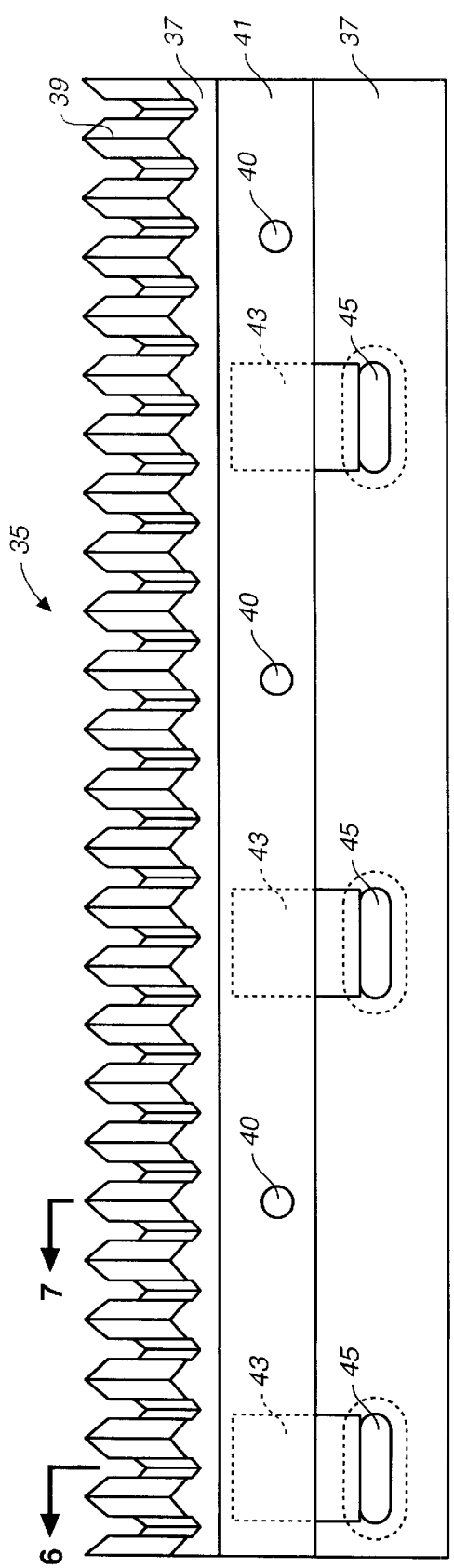
*FIG._4*
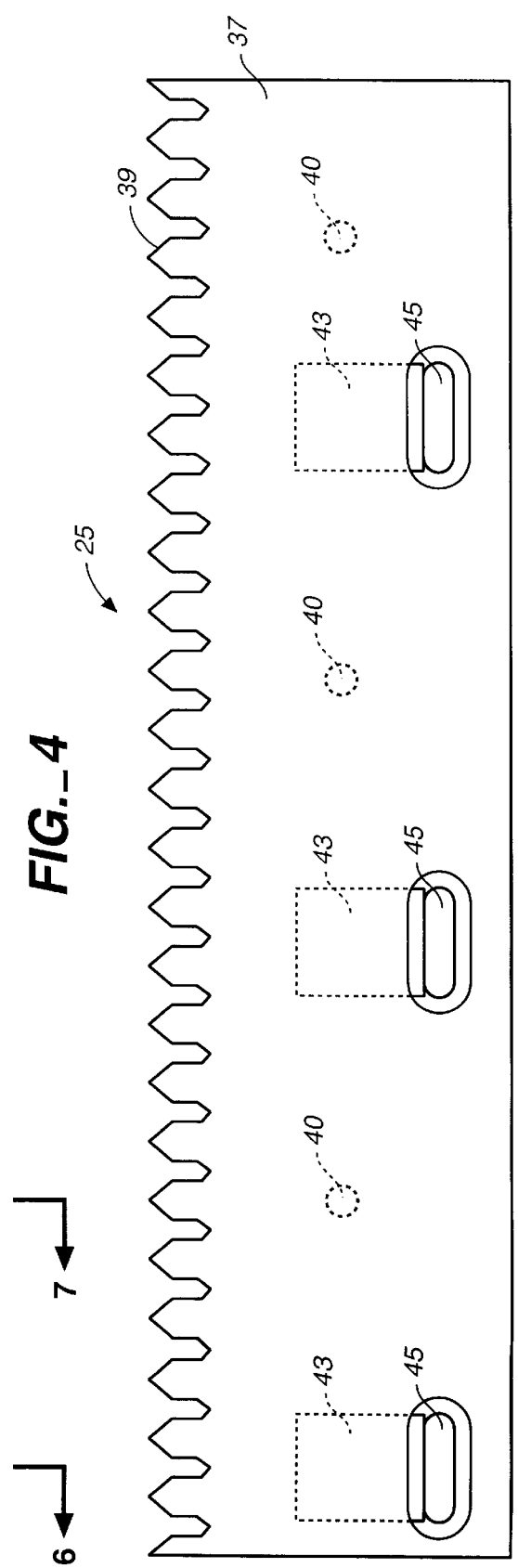
*FIG._5*

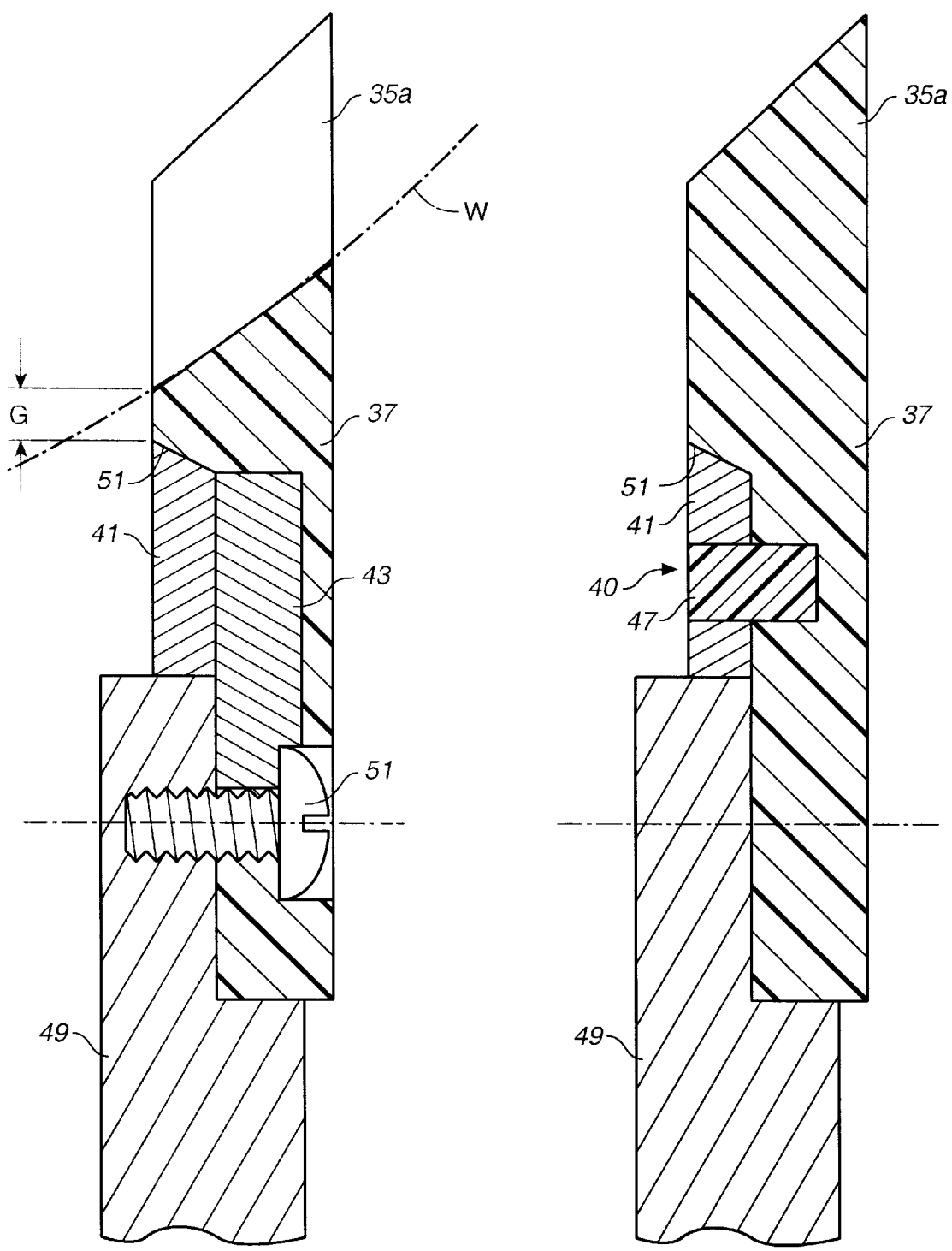
FIG._6   FIG._7

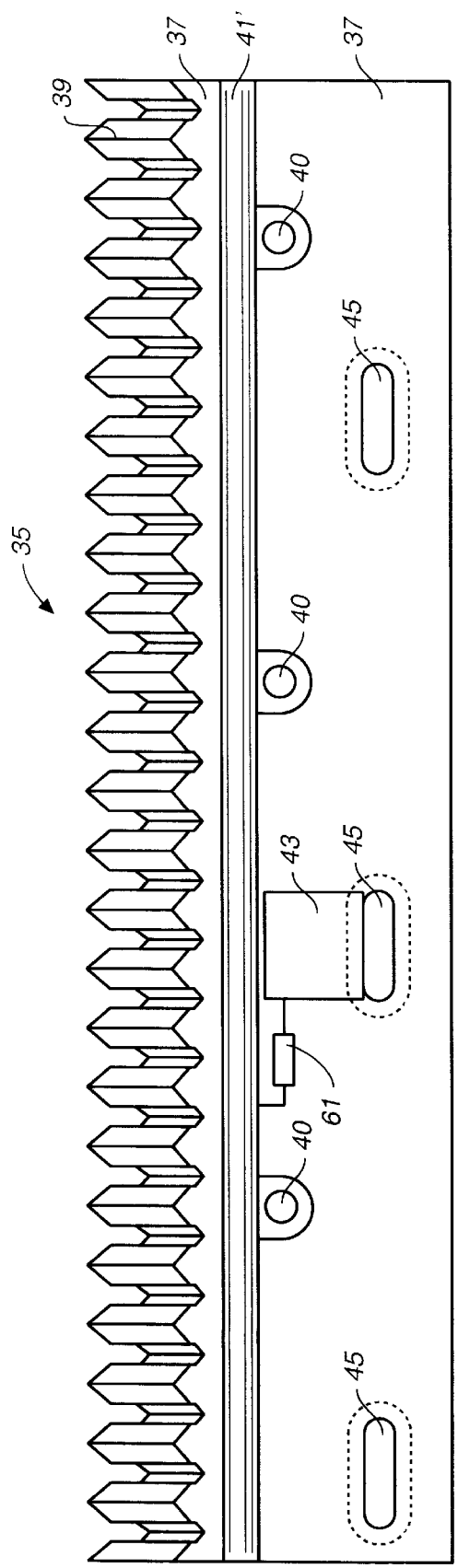
FIG._8

WAFER SUPPORT WITH ELECTROSTATIC DISCHARGE BUS

TECHNICAL FIELD

The invention relates to wafer handling in semiconductor processing, and in particular, to electrostatic discharge of wafers during processing operations.

BACKGROUND ART

In semiconductor manufacturing, operations wafers and their carriers are handled by robots and manufacturing process equipment. This creates static charges on the wafers and carriers. These charges can cause wafer damage through arcing to ground and contamination when airborne particles are attracted to the wafer. Wafers are held in cassettes which need to be changed when moving to or from a process environment. To change cassettes, wafers are lifted out of one cassette by comb like fingers made of insulative material which project into a cassette from below, and are then lowered into a new cassette which replaces the old cassette.

In the process of lifting wafers out of a first cassette, the wafers become highly electrically charged when extricated from the cassette because of decreasing capacitance relative to ground paths. If this charge is not removed, highly charged wafers will be placed in the new cassette and enter a new process environment in a condition where damage to the wafer could occur by sparking or arcing.

Many times manufacturers of wafer and wafer carrier handling equipment use static dissipative plastic components to make contact with the wafers. While this does reduce static charges, the materials currently available shed particles causing wafer contamination at the contact point. Manufacturers are seeking alternatives to this approach.

FIGS. 1–3 illustrate the above method by which wafers become charged. A cassette 11 has internal ribs 13 which loosely support a wafer 15. Cassettes have standard dimensions designed to hold a plurality of wafers, sometimes 25 or so, for simultaneous processing through a variety of machines, such as thin film coating devices, ovens, inspection and measuring devices, and other chip manufacturing machines. The cassette 11 is open at the top and bottom but inwardly turned skirt regions 17 near the bottom provide the lowermost support for the wafers, preventing wafers from dropping through the cassette. Full details of a wafer transfer machine may be seen in U.S. Pat. No. 5,193,969 to Rush et al., assigned to Fortrend Engineering Corporation.

The cassette 11 is placed in a wafer transfer machine 21 so that the wafers can be lifted and supported from above while a second cassette replaces the first one. The machine 21 has a support plate 23 on which cassette 11 may rest, guided by side rails 25. A pair of wafer rack members 27 project through the support plate 23. The rack members 27 are spaced apart, insulative, polymer members which have a comb shape with upwardly projecting teeth, allowing wafers to be positioned between teeth. Motor controlled metal shafts 28 support the rack members 27 with a wafer lifting operation initiated by an operator pushing a button 30. The objective is to raise the wafer to a gantry 29 where arms 31 will hold the wafer 15 while the lifters are retracted to a position below support plate 23 and another cassette is placed in replacement of cassette 11.

As a wafer is raised to the position shown in FIG. 3, capacitance of the wafer relative to ground changes substantially compared to the capacitance in the wafer configuration of FIG. 1. Charge induced onto the wafer in its lower position is now isolated on the wafer. The voltage associated with the isolated charge increases as capacitance of the wafer relative to ground decreases. Voltages of several kilovolts are common. With a new cassette in place, the lifters are raised until the rack members 27 contact the wafer, arms 31 are released, and the wafers are lowered into the new cassette. However, the high voltages now on the wafers have the potential of damaging wafers upon entry into a process environment.

An object of the invention was to provide an apparatus for electrostatic discharge of wafers in wafer transfer operations.

SUMMARY OF THE INVENTION

The above object has been achieved in a wafer support for particular use with a wafer transfer machine having a structure for discharge of static electricity from wafers. In particular, a comb structure with parallel teeth, spaced apart by a dimension allowing semiconductor wafers to fit between teeth, as in a rack, has an electrically grounded bus bar across the shank of the comb a slight distance, less than one millimeter, below a wafer supported by teeth of the comb. The slight distance is selected to be sufficiently close for corona discharging or electrostatic arcing to occur between the wafer and the bus bar. The bus bar is a strip fastened to the shank of the comb by cross bar members. Both the bus bar and the cross bar members are made of a high resistivity polymer having a low coefficient of thermal expansion and good machinability. High resistivity means resistivity of at least one thousand megohms per square, yet allowing full electrostatic discharge within a few seconds or less. The cross bar members are fastened to aluminum lifter shafts which act as electrical ground for the wafer support and provide mechanical lift forces for the wafer support and wafers held therein.

As wafers are raised by the lifters and a pair of comb structures, electrostatic charge accumulates on the wafers as described above. A high accumulation of charge gives rise to electrical arcing between the wafer and the bus bar on a supporting comb structure thereby discharging the wafer.

BRIEF DESCRIPTION OF THE DRAWINGS

FIGS. 1–3 are perspective views of a wafer transfer machine of the prior art shown with a wafer cassette at the start of a wafer transfer operation.

FIG. 4 is a front side view of an electrostatic discharge wafer support apparatus in accord with the present invention.

FIG. 5 is a back side view of the wafer support apparatus of FIG. 4.

FIG. 6 is a sectional view of the wafer support apparatus of FIG. 4 taken along lines 6—6 of FIG. 4.

FIG. 7 is a sectional view of the wafer support apparatus of FIG. 4 taken along lines 7—7 of FIG. 4.

FIG. 8 is a front side view of an alternative embodiment electrostatic discharge wafer support apparatus similar to that illustrated in FIG. 4.

BEST MODE FOR CARRYING OUT THE INVENTION

With reference to FIGS. 4 and 5, an elongated polymer rack member 35 is the upper end of a wafer support apparatus of the present invention. The rack member 35 is shaped like a comb structure having a shank 37 and parallel, spaced apart teeth 39 extending upwardly from the shank.

Polymer rack member 35 should be electrically and thermally insulative. Because the semiconductor manufacturing industry places a high premium on wafers free from contamination, electrically and chemically inert materials are preferred for any tool contacting wafers. A sample comb structure material is sold under the trademark "Delrin". The teeth 39 are identical and extend upwardly from shank 37 by several millimeters, each tooth forming a peak and is used to guide wafers into a slot between adjacent teeth.

About 0.5 to 1 millimeters below the teeth 39 is a conductive bus bar 41 on the shank 37 of the comb structure. The bus bar is an electrically dissipative polymer material, about one centimeter wide, mechanically secured to the shank 37 by polymer dowel members in holes 40. The preferred material for the bus bar is known as Semitron ESD 225, a trademark for static dissipative acetal. Other static dissipative materials will work. This material has volume resistivity of $10^{10}$ to $10^{12}$ ohms per square, although resistivities in the range $10^8$ to $10^{14}$ are believed to work effectively. The bus bar is spaced close enough to teeth 39 so that wafers having high electrostatic voltage and supported in the teeth can discharge the voltage by arc discharge to the bus bar which is electrically connected to ground through cross bars 43. The cross bars 43 are made of the same material as the bus bars and are connected on one side the bus bars and on the opposite side to metal lifter shafts through screw holes 45.

In FIGS. 6 and 7, the tooth 35a is seen to extend above the flag shaped shank 37 while supporting a wafer W, shown by a dashed line. The bus bar 41 is connected to the shank 37 by a dowel 47 inserted in hole 40. The cross bar member 43 resides in a slot in the shank 37 providing an electrical path from the bus bar 41 to the conductive lifter shaft 49 by way of conductive screw 51. The conductive lifter shaft is at ground potential and is preferably made of aluminum. The uppermost portion of the conductive bus bar 41 is seen to have a point at region 51 which allows for a more concentrated electric field intensity thereby promoting electrical arcing across the gap defined between the heads of arrows G—G. This gap will be jumped by an electrical arc from the wafer to bus bar 41 in order to discharge the wafer. The high resistivity of the bus bar allows the bus bar to discharge in a time slow enough that high currents into the lifter shafts, and thus to ground, are avoided.

Rather than a high resistivity bus bar 41, a low resistivity, high conductivity bus bar 41, could be used, such as a highly conductive metal rod as illustrated in FIG. 8. To avoid high currents, a high value resistor 61 could be placed in series with the rod. In general, manufacturers of semiconductor integrated circuits are concerned that metal from the metal rod may be sputtered onto the wafer by action of the arc or spark which discharges the wafer. A conductive polymer of the type described above leaves no detectable ash or residue on the wafer after arcing. In the present invention two comb structures have been shown supporting a wafer in a wafer transfer machine, but only one is shown with a static dissipating bus bar. It will be realized that both comb structures could have similar static dissipating bus bars.

What is claimed is:

1. An electrostatic discharge wafer support apparatus used in combination with wafer handling comprising, two, elongated, spaced apart insulative polymer rack members supporting opposed circumferential sides of a plurality of wafers, a conductive bus bar having an electrically resistive path to ground and supported by a polymer rack member a distance from a wafer sufficiently close for electrical discharging between the wafer and the bus bar, whereby electrical discharging between a wafer and the bus bar is discharged to ground potential.

2. The apparatus of claim 1 wherein the insulative polymer members are comb structures, each comb structure having a shank and parallel, spaced apart teeth extending from the shank in parallel relation.

3. The apparatus of claim 2 wherein the bus bar is disposed on the comb shank.

4. The apparatus of claim 1 wherein the conductive bus bar is a metal member with a resistor in series with the member.

5. The apparatus of claim 1 wherein the conductive bus bar has resistivity in the range of $10^8$ ohms per square to $10^{14}$ ohms per square.

6. An electrostatic discharge wafer support apparatus used in combination with a wafer transport machine comprising, at least two insulative polymer rack members supporting opposed circumferential sides of a plurality of wafers relative to a standard size cassette having an open bottom though which the members are moved, a bus bar having resistivity in the range of $10^8$ ohms per square to $10^{14}$ ohms per square supported by a polymer rack member a distance from a wafer sufficiently close for electrical arcing between the wafer and the bus bar, and electrically conductive members at electrical ground potential connected to the bus bar whereby electrical discharging between a wafer and the bus bar is discharged to ground potential through the conductive members.

7. The apparatus of claim 6 wherein the insulative polymer rack members are comb structures, each comb structure having a shank and parallel, spaced apart teeth extending from the shank in parallel relation.

8. The apparatus of claim 7 wherein the bus bar is disposed on the comb shank.

9. The apparatus of claim 6 wherein the conductive members are lifter shafts.

10. The apparatus of claim 9 wherein the lifter bars are connected to the bus bar with cross bar members having resistivity in the range of $10^8$ ohms per square to $10^{14}$ ohms per square.

11. An electrostatic discharge wafer support apparatus comprising, a comb structure having a plurality of parallel teeth spaced apart by a dimension allowing semiconductor wafers to fit between the teeth in a frictionless manner, the teeth extending from a shank providing contacting support to a number of wafers determined by the number of teeth, and an electrically grounded bus bar running along the length of the shank and spaced a distance from the wafers sufficiently close for electrostatic discharging between the wafers.

12. The apparatus of claim 11 wherein the bus bar is a high resistivity polymer.

13. The apparatus of claim 12 wherein the high resistivity polymer is static dissipative.

14. The apparatus of claim 11 wherein the bus bar is grounded to an electrically conductive lifter shaft through a high impedance path.

15. The apparatus of claim 14 further defined by a plurality of cross bar members connecting the bus bar to the lifter shaft.

16. The apparatus of claim 15 wherein the cross bar members are made of a high resistivity polymer.

17. The apparatus of claim 11 wherein a pair of comb structures are aligned in a parallel, spaced apart relation with semiconductor wafers contacting both comb structures for support, with one of the comb structures having said bus bar.

18. The apparatus of claim 15 wherein each comb structure is supported by an electrically conductive lifter shaft.

19. The apparatus of claim 11 wherein the bus bar is conductive metal.

20. The apparatus of claim 11 wherein a pair of comb structures support the wafer, at least one of the comb structures having an electrically grounded bus bar.

* * * * *